(12) United States Patent
Lee (10) Patent No.: US 11,170,840 B1
(45) Date of Patent: Nov. 9, 2021

(54) SRAM WRITE ASSIST DEVICE AND METHOD

(71) Applicant: REALTEK SEMICONDUCTOR CORPORATION, Hsinchu (TW)

(72) Inventor: Hung-Yu Lee, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/148,608

(22) Filed: Jan. 14, 2021

(30) Foreign Application Priority Data

Apr. 30, 2020 (TW) .................................. 109114577

(51) Int. Cl.
*G11C 5/14* (2006.01)
*G11C 11/4074* (2006.01)
*G11C 5/06* (2006.01)
*G11C 11/4094* (2006.01)

(52) U.S. Cl.
CPC ............ *G11C 11/4074* (2013.01); *G11C 5/06* (2013.01); *G11C 11/4094* (2013.01)

(58) Field of Classification Search
CPC .... G11C 11/4074; G11C 5/06; G11C 11/4094
USPC ........................................................ 365/226
See application file for complete search history.

(56) References Cited

U.S. PATENT DOCUMENTS

| | | | |
|---|---|---|---|
| 6,549,453 | B2 | 4/2003 | Wong |
| 7,324,368 | B2 | 1/2008 | Wang et al. |
| 7,596,012 | B1 | 9/2009 | Su et al. |
| 7,835,217 | B1 | 11/2010 | Su et al. |
| 8,233,342 | B2 | 7/2012 | Adams et al. |
| 8,363,453 | B2 | 1/2013 | Arsovski et al. |
| 8,630,132 | B2 | 1/2014 | Cheng et al. |
| 9,070,432 | B2 | 6/2015 | Hsieh et al. |
| 2007/0081379 | A1 | 4/2007 | Clinton et al. |
| 2007/0121370 | A1 | 5/2007 | Ellis et al. |
| 2015/0364184 | A1* | 12/2015 | Park ........................ G11C 7/12 365/156 |
| 2019/0035455 | A1* | 1/2019 | Fujiwara .................. G11C 7/12 |

* cited by examiner

*Primary Examiner* — Huan Hoang
(74) *Attorney, Agent, or Firm* — WPAT, PC (57) ABSTRACT

An SRAM write assist device includes: a power circuit supplying power to an SRAM-cells column and then stopping supplying power to make the voltage of a power-receiving terminal of the SRAM-cells column floating; a write driving circuit coupling a bit line of the SRAM-cells column with a ground terminal according to a data signal in a write drive phase; a charge sharing circuit coupling the power-receiving terminal with the first terminal of a capacitor to lower this terminal's floating voltage by charge sharing in a charge sharing phase; a charging circuit including a switch turned on to charge the capacitor with an operating voltage in a charge phase; and a negative-voltage coupling circuit including the capacitor whose first and second terminals are coupled to a ground terminal and the bit line respectively to lower the voltage of the bit line by charge sharing in a negative-voltage generation phase.

12 Claims, 9 Drawing Sheets

S910 in a write preparation phase, supplying a power voltage to a power-receiving terminal of a column of SRAM cells according to a selection signal, and then stopping supplying the power voltage to the column of SRAM cells according to the selection signal

S930 in a charge sharing phase, switching on a second path between the power-receiving terminal and a first terminal of a charge sharing capacitor of the voltage coupling circuit according to a charge sharing control signal to lower the voltage at the power-receiving terminal of the column of SRAM cells by charge sharing

S940 in a charge phase, switching on a third path between an operation voltage terminal and the first terminal of the charge sharing capacitor according to the charge sharing control signal and a first switch signal to charge the charge sharing capacitor with a voltage at the operation voltage terminal

S920 in a write drive phase, switching on a first path between the column of SRAM cells and a voltage coupling circuit according to a data signal to couple a bit line of the column of SRAM cells to a first low voltage terminal through the voltage coupling circuit and pull down a voltage of the bit line to a voltage of the first low voltage terminal

S950 in a voltage generation phase, coupling the first terminal of the charge sharing capacitor with a second low voltage terminal and coupling a second terminal of the charge sharing capacitor with the bit line of the column of SRAM cells to pull down the voltage of the bit line of the column of SRAM cells

Fig. 9

SRAM WRITE ASSIST DEVICE AND METHOD

BACKGROUND OF THE INVENTION

1. Field of the Invention

The present invention relates to a static random access memory (SRAM), especially to an SRAM write assist device and method.

2. Description of Related Art

Figure 1:
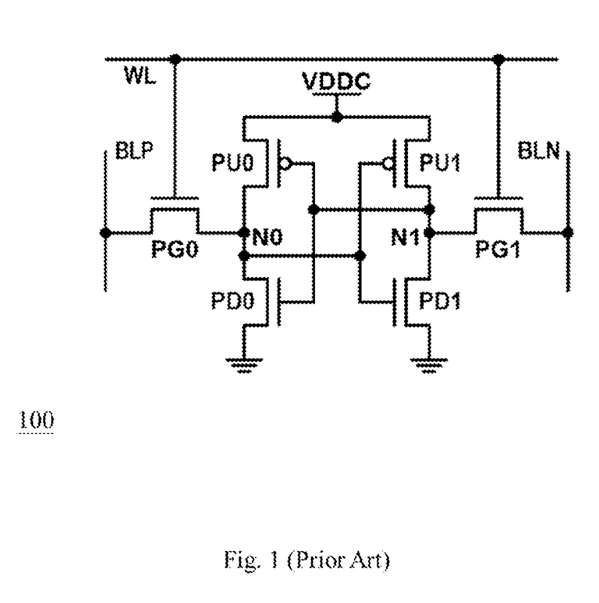
FIG. 1 shows a conventional SRAM cell.

As the semiconductor processes develop, it becomes much harder to ensure the write capability of a static random access memory (SRAM). This is because a pass-gate transistor (e.g., PG0/PG1 of FIG. 1) and a pull-up transistor (e.g., PU0/PU1 of FIG. 1) of the SRAM cell have similar capabilities in an advanced semiconductor process. FIG. 1 shows a conventional SRAM cell 100. The circuit labels/symbols in FIG. 1 are illustrated with Table 1 below while some common circuit components and symbols (e.g., ground terminals) are not described in detail here. Generally, during a write cycle, the voltage of a word line (WL) is pulled up to an operation voltage (VDD) to turn on a pass-gate transistor (PG0/PG1); the voltage of a bit line (BLP/BLN) is pulled down to zero volt (0V) to pull down the voltage of a storage node (N0/N1), which consequently changes the storage value stored with the storage node; then the pass-gate transistor is turned off to lock up the storage value, and therefore the write operation is completed. However, as the semiconductor processes develop toward the deep sub-micron technology, the process variation gets more and more serious; when the conducted current of a pull-up transistor of an SRAM cell approaches or exceeds the conducted current of a pass-gate transistor of the SRAM cell, the voltage of a storage node of the SRAM cell cannot be pulled down to a level lower than a threshold for transition, and this leads to the failure in the write operation of the SRAM cell. The above-mentioned problem is particularly serious for an SRAM operating in a low voltage.

TABLE 1

| circuit labels/symbols in FIG. 1 | descriptions |
| --- | --- |
| 100 | SRAM cell |
| VDDC | power voltage for the SRAM cell |
| PU0, PD0, PU1, PD1 | a pair of cross-coupled inverters (latch) |
| N0, N1 | storage nodes |
| PG0, PG1 | pass gates |
| WL | word line |
| BLP/BLN (for transmitting bit signal/inverted bit signal) | bit lines |

Figure 2:
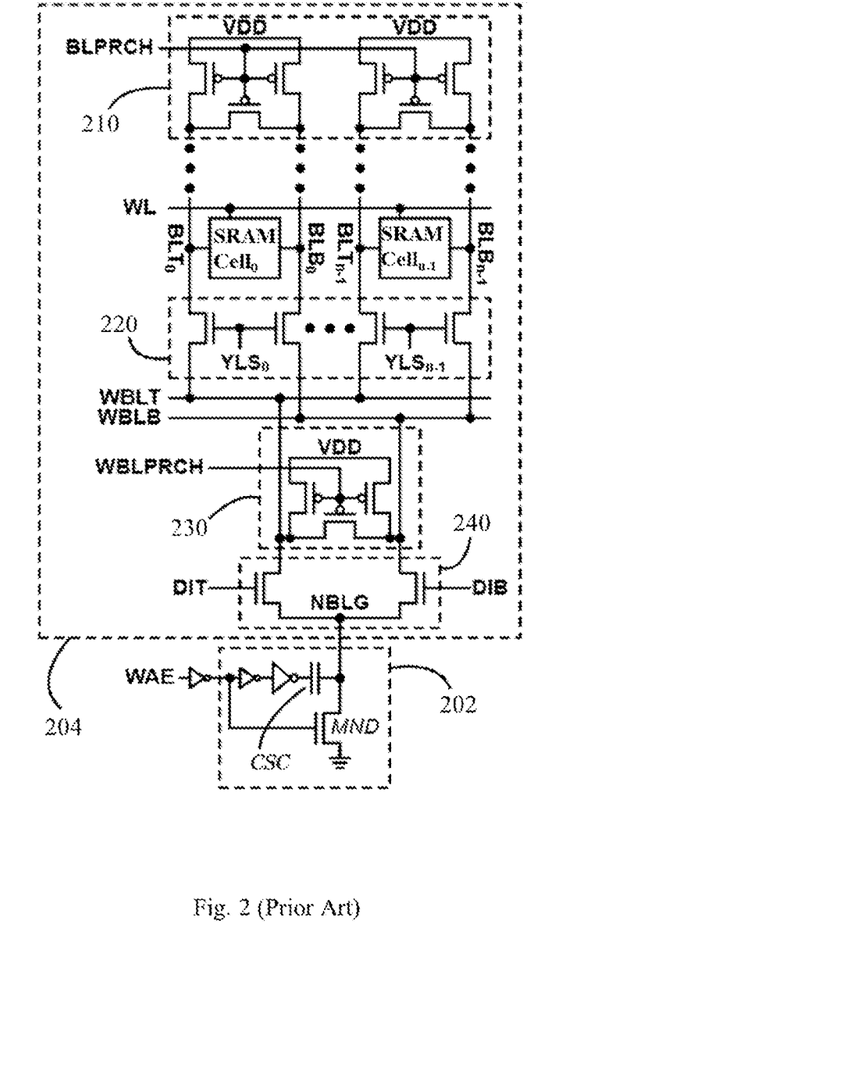
FIG. 2 shows a conventional write assist circuit using the negative bit line technique and a conventional SRAM write circuit.
Figure 3:
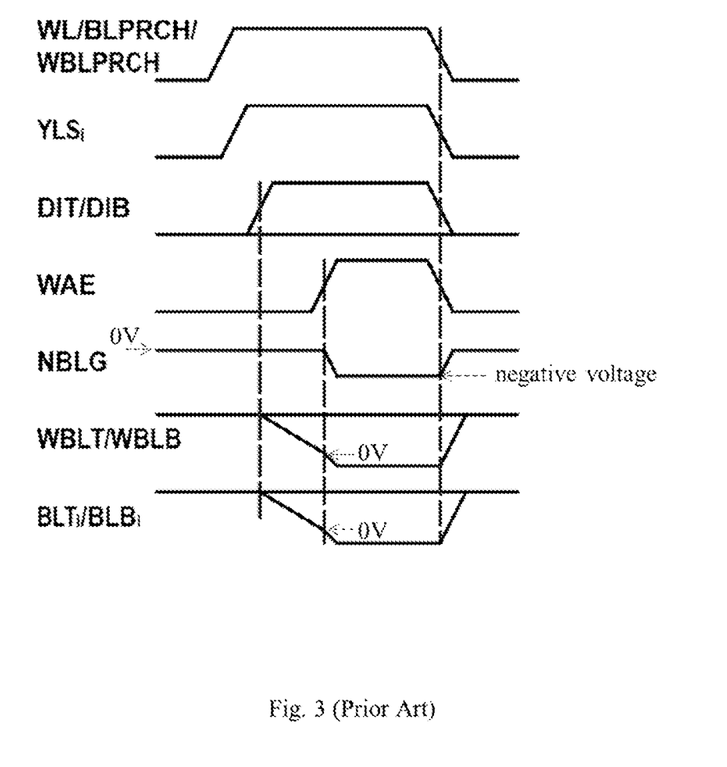
FIG. 3 shows a timing diagram of FIG. 2.

For solving the aforementioned problems, there are two kinds of conventional techniques as follows:

(1) Negative Bit-Line (NBL) technique: This technique can increase the conducted current of a pass-gate transistor of an SRAM cell to improve its write capability. The principle of the NBL technique is to generate a negative voltage by capacitive coupling when the voltage of a bit line of an SRAM cell is pulled down to 0V in the late stage of a write cycle, and then provide the negative voltage for the bit line by charge sharing to increase the voltage drop ($V_{GS}$) between the gate and source of a pass-gate transistor of the SRAM cell; accordingly, the pass-gate transistor's conducting capability can be improved, the conducted current of the pass-gate transistor can be greater than the conducted current of a pull-up transistor of the SRAM cell firmly, and the voltage at a storage node of the SRAM cell can be pulled down to 0V to complete the write operation. FIG. 2 shows a conventional write assist circuit 202 using the NBL technique and a conventional SRAM write circuit 204. The circuit labels/symbols of FIG. 2 are illustrated with Table 2 below while some common circuit components and symbols (e.g., transistors, inverters, and ground terminals) are not described in detail here. FIG. 3 shows a timing diagram of the signals in FIG. 2, wherein the vertical dashed lines in FIG. 3 are reference lines indicative of time alignment. The problems of the above-mentioned NBL technique include: the capacitance of the charge sharing capacitor (CSC) should be great enough to match the parasitic capacitors caused by different bit lines with different lengths, so that the voltages of the bit lines (BLT/BLB) can be pulled down to a level low enough. However, the CSC should be fully charged and discharged in every write cycle, and thus a greater capacitance of the CSC can bring a higher power consumption. Several NBL techniques are found in the following US patents/patent application publications: U.S. Pat. Nos. 8,233,342; 8,363,453; 9,070,432; US20070081379A1.

TABLE 2

| circuit and signal labels/symbols in FIG. 2 | descriptions |
| --- | --- |
| 202 | write assist circuit |
| 204 | SRAM write circuit |
| 210 | bit line pre-charge circuit |
| 220 | multiplexer |
| 230 | write bit line pre-charge circuit |
| 240 | write driver |
| VDD | operation voltage |
| BLPRCH/WBLPRCH | bit line pre-charge signal/write bit line pre-charge signal |
| WL | word line |
| $BLT_0$~$BLT_{n-1}$ | $0^{th}$ bit line signal~$(n-1)^{th}$ bit line signal |
| $BLB_0$~$BLB_{n-1}$ | $0^{th}$ inverted bit line signal~$(n-1)^{th}$ inverted bit line signal |
| SRAM Cell$_0$~SRAM Cell$_{n-1}$ | $0^{th}$ SRAM cell~$(n-1)^{th}$ SRAM cell |
| $YLS_0$~$YLS_{n-1}$ | selection signal for $0^{th}$ column~selection signal for $(n-1)^{th}$ column |
| WBLT/WBLB | write bit line signal/inverted write bit line signal |
| DIT/DIB | data input signal/inverted data input signal |
| NBLG | negative bit line gate |
| WAE | write assist control signal |
| CSC | charge sharing capacitor |
| MND | switch |

Figure 4:
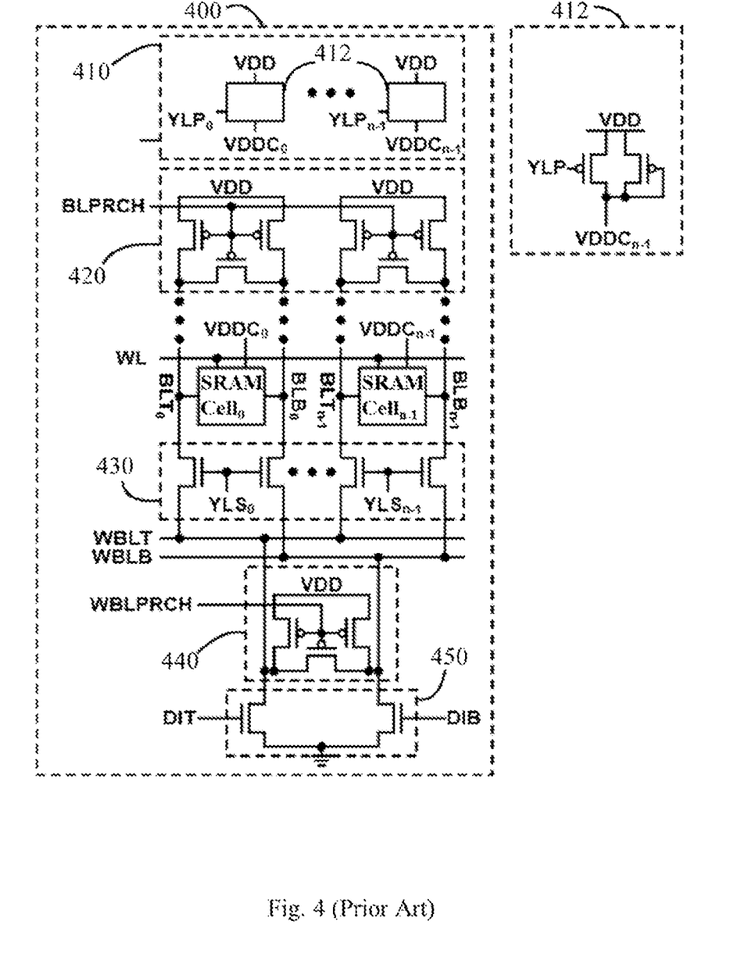
FIG. 4 shows a conventional write assist circuit using the voltage decrease technique included in a conventional SRAM write circuit.
Figure 5:
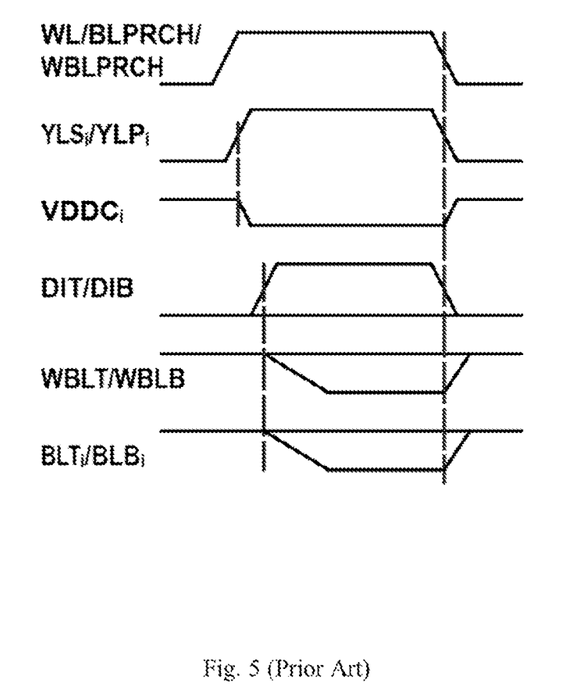
FIG. 5 shows a timing diagram of the signals in FIG. 4.

(2) Technique for decreasing the power voltage for SRAM cells (hereafter referred to as voltage decrease technique): The voltage decrease technique can reduce the conducted current of a pull-up transistor to make a write operation easier. The principle of this technique is to decrease or stop supplying the power voltage (e.g., one of $VDDC_0$~$VDDC_{n-1}$ in FIG. 4) for a selected column of SRAM cells so that the conducted current of a pass-gate transistor is more likely to be higher than the conducted current of a pull-up transistor and thereby the voltage of the storage node can be pulled down to 0V to complete the write operation. FIG. 4 shows a conventional write assist circuit 410 (power module) using the voltage decrease technique included in a conventional SRAM write circuit 400; FIG. 4 also shows an embodiment of a power cell 412 in the write assist circuit 410. The circuit and signal labels/symbols are illustrated with Table 3 below while some common circuits and symbols (e.g., transistors and ground terminals) are not described in detail here. FIG. 5 shows a timing diagram of the signals in FIG. 4, wherein the vertical dashed lines in FIG. 5 are reference lines indicative of time alignment. The problems of the above-mentioned voltage decrease technique include: reducing or stopping supplying the voltage for a column of SRAM cells (e.g., reducing the voltage for the column of SRAM cells by a threshold voltage of a diode as mentioned in the US patent of patent number U.S. Pat. No. 6,549,453) may affect the column of SRAM cells' capability of locking up data. Several kinds of voltage decrease techniques are found in the following US patents/patent application publications: U.S. Pat. Nos. 6,549,453; 7,324,368; 7,596,012; 8,630,132; 7,835,217; US2007/0121370.

TABLE 3

| circuit and signal labels/symbols in FIG. 4 | Description |
| --- | --- |
| 400 | SRAM write circuit |
| 410 | write assist circuit (power module) |
| 412 | power cell for one column of SRAM cells |
| 420 | bit line pre-charge circuit |
| 430 | multiplexer |
| 440 | write bit line pre-charge circuit |
| 450 | write driver |
| VDD | operation voltage |
| $VDDC_0 \sim VDD_{n-1}$ | power voltage for $0^{th}$ column~power voltage for $(n-1)^{th}$ column |
| $YLP_0 \sim YLP_{n-1}$ | power selection signal for $0^{th}$ column~power selection signal for $(n-1)^{th}$ column |
| BLPRCH/WBLPRCH | bit line pre-charge signal/write bit line pre-charge signal |
| WL | word line |
| $BLT_0 \sim BLT_{n-1}$ | $0^{th}$ bit line signal~$(n-1)^{th}$ bit line signal |
| $BLB_0 \sim BLB_{n-1}$ | $0^{th}$ inverted bit line signal~$(n-1)^{th}$ inverted bit line signal |
| SRAM Cell$_0$~SRAM Cell$_{n-1}$ | $0^{th}$ SRAM cell~$(n-1)^{th}$ SRAM cell |
| $YLS_0 \sim YLS_{n-1}$ | selection signal for $0^{th}$ column~selection signal for $(n-1)^{th}$ column |
| WBLT/WBLB | write bit line signal/inverted write bit line signal |
| DIT/DIB | data input signal/inverted data input signal |

SUMMARY OF THE INVENTION

An object of the present disclosure is to provide a static random access memory (SRAM) write assist device and method.

An embodiment of the SRAM write assist device of the present disclosure includes a power circuit, a write driving circuit, a charge sharing circuit, a coupling-capacitor charging circuit, and a negative voltage coupling circuit. The power circuit is configured to supply a power voltage to a column of SRAM cells according to a power supply selection signal in a write preparation phase, and then stop supplying the power voltage to the column of SRAM cells according to the power supply selection signal to let a voltage at a power-receiving terminal of the column of SRAM cells be in a floating state. The write driving circuit is coupled between the column of SRAM cells and a negative voltage coupling circuit, and configured to be turned on according to a data signal in a write drive phase to couple a bit line of the column of SRAM cells with a first low voltage terminal through the negative voltage coupling circuit, which consequently pulls down a voltage of the bit line of the column of SRAM cells to a voltage of the first low voltage terminal. The charge sharing circuit is coupled between the power circuit and the negative voltage coupling circuit, and configured to be turned on according to a charge sharing control signal in a charge sharing phase to couple the power-receiving terminal of the column of SRAM cells with a first terminal of a charge sharing capacitor included in the negative voltage coupling circuit, which consequently lowers the voltage at the power-receiving terminal of the column of SRAM cells by charge sharing between the power-receiving terminal of the column of SRAM cells and the first terminal of the charge sharing capacitor. The coupling-capacitor charging circuit is used for charging the charge sharing capacitor, and includes a charge switch coupled between an operation voltage terminal and the first terminal of the charge sharing capacitor; the charge switch is configured to be turned on according to the charging sharing control signal and a first switch signal in a charge phase and thereby let the charge sharing capacitor be charged with a voltage at the operation voltage terminal, wherein the charge sharing circuit is turned off according to the charging sharing control signal in the charge phase. The negative voltage coupling circuit includes the aforementioned capacitor, wherein the first terminal of the charge sharing capacitor is coupled to a second low voltage terminal in a negative voltage generation phase, and a second terminal of the charge sharing capacitor is coupled to the bit line of the column of SRAM cells through the write driving circuit in the negative voltage generation phase to pull down the voltage of the bit line of the column of SRAM cells. In the negative voltage generation phase, the charge switch is turned off, and a path for coupling the bit line of the column of SRAM cells with the first low voltage terminal through the negative voltage coupling circuit is shut off.

An embodiment of the SRAM write assist method includes the following steps: in a write preparation phase, supplying a power voltage to a column of SRAM cells according to a power supply selection signal, and then stopping supplying the power voltage to the column of SRAM cells according to the power supply selection signal to let a voltage at a power-receiving terminal of the column of SRAM cells be in a floating state; in a write drive phase, switching on a first path between the column of SRAM cells and a voltage coupling circuit according to a data signal to couple a bit line of the column of SRAM cells with a first low voltage terminal through the voltage coupling circuit and thereby pull down a voltage of the bit line of the column of SRAM cells to a voltage of the first low voltage terminal; in a charge sharing phase, switching on a second path between the power-receiving terminal of the column of SRAM cells and a first terminal of a charge sharing capacitor included in the voltage coupling circuit according to a charge sharing control signal to lower the voltage at the power-receiving terminal of the column of SRAM cells by charge sharing between the power-receiving terminal of the column of SRAM cells and the first terminal of the charge sharing capacitor; in a charge phase, switching on a third path between an operation voltage terminal and the first terminal of the charge sharing capacitor according to the charge sharing control signal and a first switch signal to charge the charge sharing capacitor with a voltage at the operation voltage terminal, wherein in the charge phase the second path between the power-receiving terminal of the column of SRAM cells and the first terminal of the charge sharing capacitor is shut off; and in a voltage generation phase, coupling the first terminal of the charge sharing capacitor with a second low voltage terminal and coupling a second terminal of the charge sharing capacitor with the bit line of the column of SRAM cells to pull down the voltage of the bit line of the column of SRAM cells, wherein in the voltage generation phase the third path between the operation voltage terminal and the first terminal of the charge sharing capacitor is shut off and the first path for coupling the bit line of the column of SRAM cells with the first low voltage terminal through the voltage coupling circuit is shut off.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present disclosure includes a static random access memory (SRAM) write assist device and method. In comparison with the prior art, the device and method can fulfill the write assist function with a charge sharing capacitor having smaller capacitance and can reduce power consumption.

Figure 6:
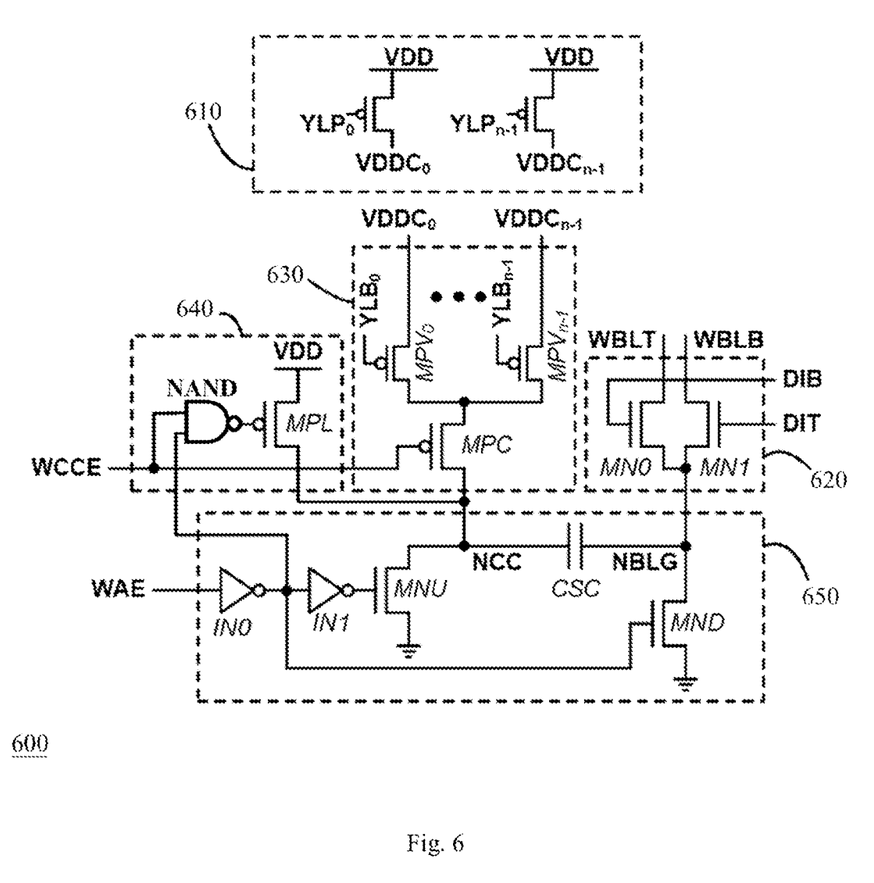
FIG. 6 shows an embodiment of the SRAM write assist device of the present disclosure.

FIG. 6 shows an embodiment of the SRAM write assist device of the present disclosure. The SRAM write assist device 600 of FIG. 6 includes a power circuit 610, a write driving circuit 620, a charge sharing circuit 630, a coupling-capacitor charging circuit 640, and a negative voltage coupling circuit 650. These circuits are described in detail below.

In a write preparation phase, the power circuit 610 is configured to supply a power voltage (i.e., VDDCi which is one of $VDDC_0 \sim VDDC_{n-1}$) to a power-receiving terminal of a column of SRAM cells (e.g., a column of SRAM cells including the SRAM Cell$_i$, wherein an example of the SRAM Cell$_i$ is one of the SRAM Cell$_0$~SRAM Cell$_{n-1}$ in FIG. 4) according to a power supply selection signal (i.e., YLP$_i$ which is one of $YLP_0 \sim YLP_{n-1}$), and then stop supplying the power voltage to power-receiving terminal of the column of SRAM cells according to the power supply selection signal to let a voltage (e.g., VDDCi) at the power-receiving terminal of the column of SRAM cells be in a floating state.

The write driving circuit 620 is coupled between the column of SRAM cells and the negative voltage coupling circuit 650, and includes two transistors MN0, MN1 that are used for receiving two data signals DIT, DIB, wherein DIB is equivalent to an inverted signal of DIT. In a write drive phase, the write driving circuit 620 is turned on according to the data signal (DIT/DIB) to couple a bit line (BLTi/BLBi) of the column of SRAM cells with a first low voltage terminal (e.g., the ground terminal coupled with the transistor MND in FIG. 6, wherein the transistor MND is turned on in this phase) through a write bit line (WBLT/WBLB) and a negative bit line gate (NBLG) of the negative voltage coupling circuit 650, which consequently pulls down the voltage of the bit line of the column of SRAM cells to the voltage (e.g., zero volt (0V)) of the first low voltage terminal. An example of BLTi is one of $BLT_0 \sim BLT_{n-1}$ in FIG. 4, and an example of BLBi is one of $BLB_0 \sim BLB_{n-1}$ in FIG. 4.

The charge sharing circuit 630 is coupled between the power circuit 610 and the negative voltage coupling circuit 650. In a charge sharing phase, the charge sharing circuit 630 is turned on according to a charge sharing control signal (WCCE) to let the power-receiving terminal of the column of SRAM cells be coupled to a first terminal (e.g., a positive-electrode terminal) of a charge sharing capacitor (CSC) of the negative voltage coupling circuit 650 through a node (NCC), and thereby the voltage (VDDCi) at the power-receiving terminal of the column of SRAM cells is lowered by the charge sharing between the power-receiving terminal of the column of SRAM cells and the first terminal of the charge sharing capacitor. Since the voltage at the power-receiving terminal of the column of SRAM cells is decreased, it will be easier to write data into the to-be-written SRAM cell (i.e., SRAM Cell$_i$). In the embodiment of FIG. 6, the charge sharing circuit 630 includes a column selection switch (i.e., MPV$_i$ which is one of $MPV_0 \sim MPV_{n-1}$) and a charge sharing switch (MPG). The column selection switch is configured to be turned on according to a column selection signal (YLB$_i$ which is one of $YLB_0 \sim YLB_{n-1}$) in the charge sharing phase and thereby let the power-receiving terminal of the column of SRAM cells be coupled with the charge sharing switch, wherein the column selection signal is related to the power supply selection signal (YLP$_i$). The charge sharing switch is configured to be turned on according to the charge sharing control signal and thereby let the power-receiving terminal of the column of SRAM cells be coupled with the first terminal of the charge sharing capacitor (CSC).

The coupling-capacitor charging circuit 640 includes a charge switch (MPL). The charge switch is coupled between an operation voltage terminal (VDD terminal) and the first terminal of the charge sharing capacitor (CSC), and is configured to be turned on according to the charge sharing control signal (WCCE) and a first switch signal (e.g., an inverted signal of a write assist control signal WAE as shown in FIG. 6) in a charge phase, so that the voltage (VDD) at the operation voltage terminal can charge the charge sharing capacitor (CSC) in this phase and pull up the voltage difference (e.g., |VDD-0|=VDD as shown in FIG. 6, the transistor MND in FIG. 6 being turned on in this phase) between the two terminals of the charge sharing capacitor (i.e., the first terminal and a second terminal (e.g., a negative-electrode terminal) of the charge sharing capacitor), wherein the charge sharing circuit 630 is turned off according to the charge sharing control signal in the charge phase to avoid the voltage at the operation voltage terminal pulling up the voltage at the power-receiving terminal of the column of SRAM cells. In the embodiment of FIG. 6, the coupling-capacitor charging circuit 640 includes a charge control circuit (e.g., the NAND gate in FIG. 6) and the charge switch (MPL). The charge control circuit is configured to generate a charge control signal according to the charge sharing control signal (WCCE) and the first switch signal (inverted signal of WAE). The charge switch is configured to be turned on or turned off according to the charge control signal.

The negative voltage coupling circuit 650 includes the aforementioned charge sharing capacitor (CSC), wherein the first terminal of the charge sharing capacitor is coupled to a second low voltage terminal (e.g., the ground terminal that is coupled with the transistor MNU in FIG. 6). In the negative voltage generation phase, the second terminal of the charge sharing capacitor is coupled to the bit line of the column of SRAM cells through the write driving circuit 620; accordingly, the charge sharing capacitor will pull down the voltage of the bit line to a negative voltage due to charge sharing and thus it will be easier to write data into the to-be-written SRAM cell (SRAM Cell$_i$). It is noted that in the negative voltage generation phase, the aforementioned charge switch is turned off to prevent the operation voltage terminal from being short-circuited to the second low voltage terminal. In addition, the path for coupling the bit line of the column of SRAM cells to the first low voltage terminal through the negative voltage coupling circuit 650 is also turned off (i.e., the transistor MND in FIG. 6 is turned off) in the negative voltage generation phase.

In the embodiment of FIG. 6, the negative voltage coupling circuit 650 includes: a switch signal generating circuit (e.g., the inverters IN0, IN1 as shown in FIG. 6, wherein the inverter IN1 can be omitted optionally while the write assist control signal (WAE) is treated as the input for the gate of the transistor MNU); a first switch (transistor MND); a second switch (transistor MNU); and the charge sharing capacitor (CSC). The switch signal generating circuit is configured to generate the first switch signal (i.e., the inverted signal of WAE) according to the write assist control signal (WAE). The first switch is coupled between the second terminal of the charge sharing capacitor and the first low voltage terminal; the first switch is configured to be turned on according to the first switch signal in the charge sharing phase and the charge phase, and to be turned off according to the first switch signal in the negative voltage generation phase. The second switch is coupled between the first terminal and the second low voltage terminal of the charge sharing capacitor; the second switch is configured to be turned off according to the write assist control signal (WAE) in the charge sharing phase and the charge phase, and to be turned on according to the write assist control signal in the negative voltage generation phase.

Figure 7:
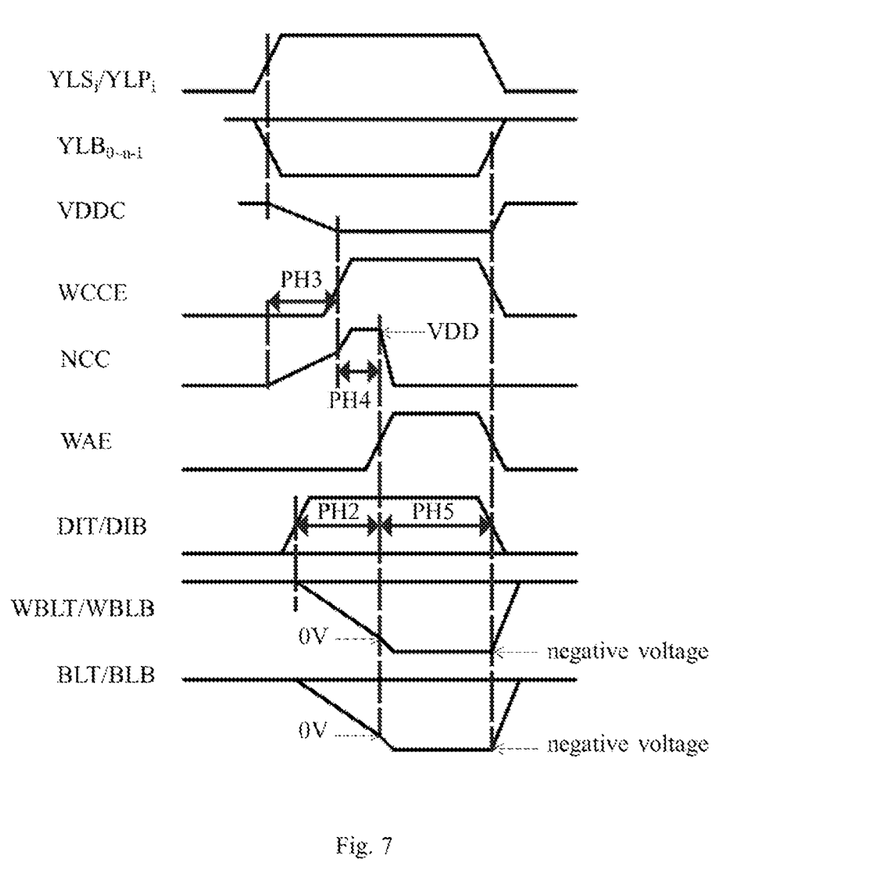
FIG. 7 shows an exemplary timing diagram of the signals in FIG. 6.

An exemplary timing diagram of the signals in FIG. 6 is illustrated with FIG. 7 wherein the vertical dashed lines are reference lines indicative of time alignment, the labels PH2, PH3, PH4, and PH5 are indicative of the write drive phase, the charge sharing phase, the charge phase, and the negative voltage generation phase. An exemplary order of the write operation phases (PH810~PH880) is illustrated with FIG. 8.

It is noted that the write driving circuit 620 is further coupled to a write bit line pre-charge circuit (e.g., the write bit line pre-charge circuit 440 in FIG. 4), a multiplexer (e.g., the multiplexer 430 in FIG. 4), and a bit line pre-charge circuit (e.g., the bit line pre-charge circuit 420 in FIG. 4). Each of the write bit line pre-charge circuit, the multiplexer, and the bit line pre-charge circuit is a known/self-developed circuit, and its operation is a known/self-developed operation; since these circuits fall beyond the discussion scope of the present disclosure, their details are omitted here. It is also noted that after the negative voltage generation phase is completed (i.e., in the late stage of a write cycle), the SRAM write assist device 600 will turn off the negative voltage coupling circuit 650 and the write driving circuit 620 (DIT=DIB=0V) in order to: enable the write bit line pre-charge circuit and the bit line pre-charge circuit, clear the charge sharing capacitor to make it store no charges, and supply the power voltage (VDDCi) to the power-receiving terminal of the column of SRAM cells.

Figure 9:
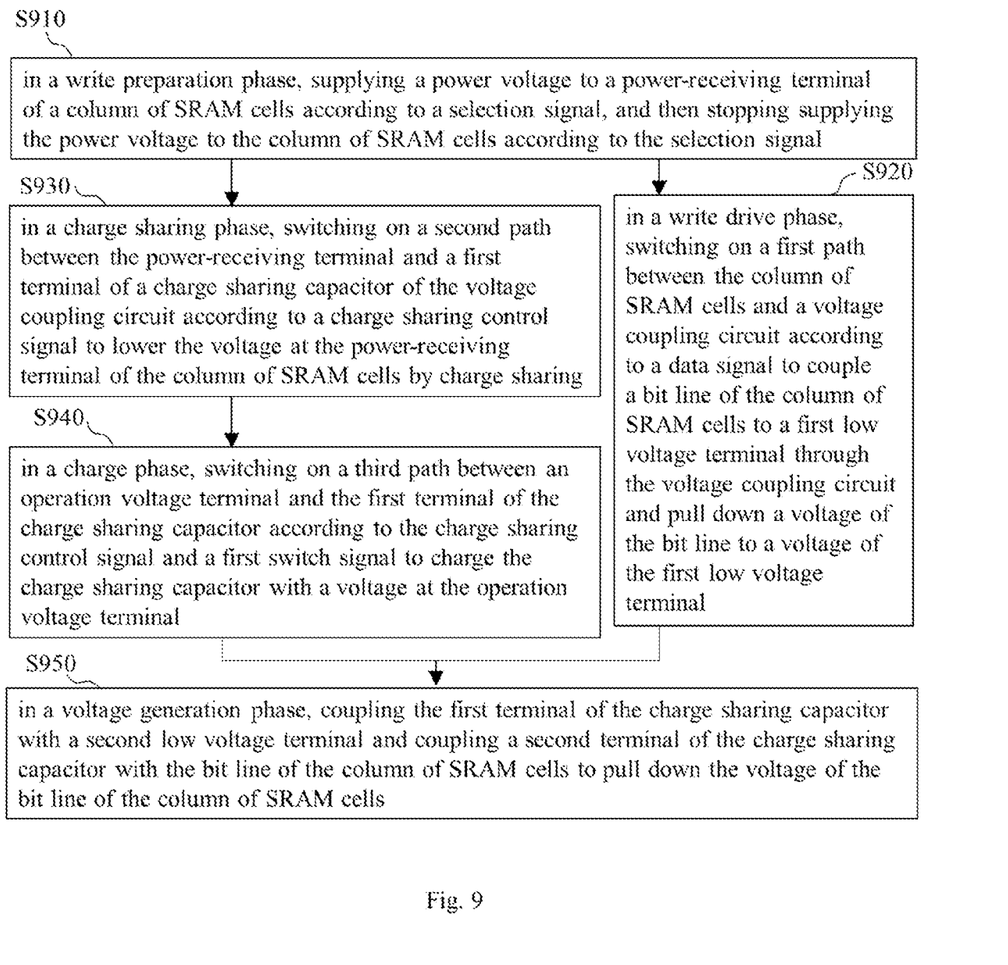
FIG. 9 shows an embodiment of the SRAM write assist method of the present disclosure.

FIG. 9 shows an embodiment of the SRAM write assist method. This embodiment includes the following steps:

step S910: in a write preparation phase, supplying a power voltage to a column of SRAM cells according to a power supply selection signal, and then stopping supplying the power voltage to the column of SRAM cells according to the power supply selection signal to let a voltage at a power-receiving terminal of the column of SRAM cells be in a floating state;

step S920: in a write drive phase, switching on a first path between the column of SRAM cells and a voltage coupling circuit according to a data signal to couple a bit line of the column of SRAM cells to a first low voltage terminal through the voltage coupling circuit and thereby pull down a voltage of the bit line of the column of SRAM cells to a voltage of the first low voltage terminal;

step S930: in a charge sharing phase, switching on a second path between the power-receiving terminal of the column of SRAM cells and a first terminal of a charge sharing capacitor included in the voltage coupling circuit according to a charge sharing control signal to lower the voltage at the power-receiving terminal of the column of SRAM cells by charge sharing between the power-receiving terminal of the column of SRAM cells and the first terminal of the charge sharing capacitor;

step S940: in a charge phase, switching on a third path between an operation voltage terminal and the first terminal of the charge sharing capacitor according to the charge sharing control signal and a first switch signal to charge the charge sharing capacitor with a voltage at the operation voltage terminal, wherein in the charge phase the second path between the power-receiving terminal of the column of SRAM cells and the first terminal of the charge sharing capacitor is shut off; and step S950: in a voltage generation phase, coupling the first terminal of the charge sharing capacitor with a second low voltage terminal and coupling a second terminal of the charge sharing capacitor with the bit line of the column of SRAM cells to pull down the voltage of the bit line of the column of SRAM cells, wherein in the voltage generation phase the third path between the operation voltage terminal and the first terminal of the charge sharing capacitor is shut off and the first path for coupling the bit line of the column of SRAM cells with the first low voltage terminal through the voltage coupling circuit is shut off.

It is noted that the steps of embodiment of FIG. 9 can be implemented in various orders as long as such implementation is practicable. For instance, step S930/step S940 can be performed when performing step S920.

Figure 8:
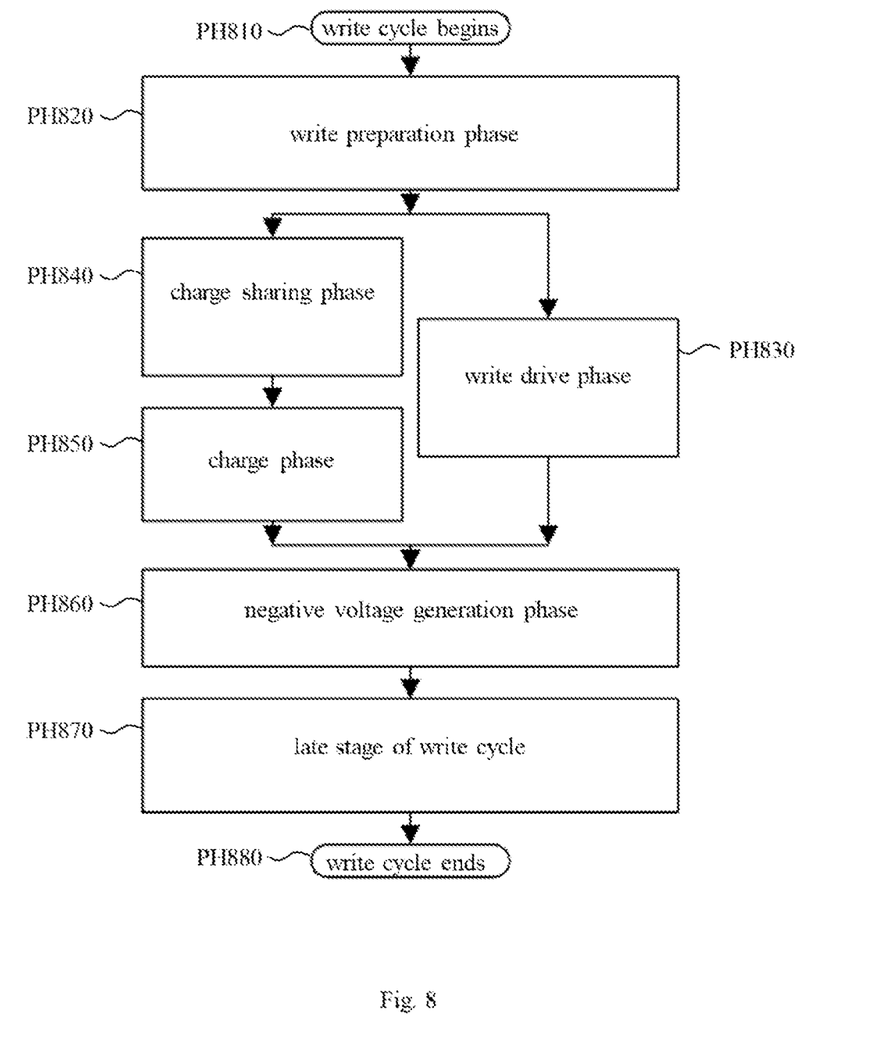
FIG. 8 shows an exemplary order of the write operation phases of the device of FIG. 6.

Since those of ordinary skill in the art can appreciate the detail and modification of the embodiment of FIG. 9 by referring to the disclosure of the embodiments of FIGS. 6-8, which implies that some or all of the features of the embodiments of FIGS. 6-8 can be applied to the embodiment of FIG. 9 in a reasonable way, repeated and redundant description is omitted here.

It is noted that people of ordinary skill in the art can selectively use some or all of the features of any embodiment in this specification or selectively use some or all of the features of multiple embodiments in this specification to implement the present invention as long as such implementation is practicable, which implies that the present invention can be implemented in various ways.

To sum up, the SRAM write assist device and method of the present disclosure can fulfill the write assist function with a charge sharing capacitor having smaller capacitance and can reduce power consumption in comparison with the prior art.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A static random access memory (SRAM) write assist device, comprising:
   a power circuit configured to supply a power voltage to a column of SRAM cells according to a power supply selection signal in a write preparation phase, and then stop supplying the power voltage to the column of SRAM cells according to the power supply selection signal to let a voltage at a power-receiving terminal of the column of SRAM cells be in a floating state;
   a write driving circuit coupled between the column of SRAM cells and a negative voltage coupling circuit, the write driving circuit configured to be turned on according to a data signal in a write drive phase to couple a bit line of the column of SRAM cells with a first low voltage terminal through the negative voltage coupling circuit and thereby pull down a voltage of the bit line of the column of SRAM cells to a voltage of the first low voltage terminal;
   a charge sharing circuit coupled between the power circuit and the negative voltage coupling circuit, the charge sharing circuit configured to be turned on according to a charge sharing control signal in a charge sharing phase to couple the power-receiving terminal of the column of SRAM cells with a first terminal of a charge sharing capacitor included in the negative voltage coupling circuit and thereby lower the voltage at the power-receiving terminal of the column of SRAM cells by charge sharing between the power-receiving terminal of the column of SRAM cells and the first terminal of the charge sharing capacitor;
   a coupling-capacitor charging circuit for charging the charge sharing capacitor, the coupling-capacitor charging circuit including a charge switch coupled between an operation voltage terminal and the first terminal of the charge sharing capacitor, the charge switch configured to be turned on according to the charging sharing control signal and a first switch signal in a charge phase and thereby let the charge sharing capacitor be charged with a voltage at the operation voltage terminal, wherein the charge sharing circuit is turned off according to the charging sharing control signal in the charge phase; and
   the negative voltage coupling circuit including the charge sharing capacitor, wherein the first terminal of the charge sharing capacitor is coupled to a second low voltage terminal in a negative voltage generation phase, and a second terminal of the charge sharing capacitor is coupled to the bit line of the column of SRAM cells through the write driving circuit in the negative voltage generation phase to pull down the voltage of the bit line of the column of SRAM cells,
   wherein in the negative voltage generation phase the charge switch is turned off, and a path for coupling the bit line of the column of SRAM cells with the first low voltage terminal through the negative voltage coupling circuit is shut off.

2. The SRAM write assist device of claim 1, wherein the charge sharing circuit includes:
   a column selecting switch configured to be turned on according to a column selection signal in the charge sharing phase to let the power-receiving terminal of the column of SRAM cells be coupled to a charge sharing switch, wherein the column selection signal is related to the power supply selection signal; and
   the charge sharing switch configured to be turned on according to the charge sharing control signal to let the power-receiving terminal of the column of SRAM cells be coupled to the first terminal of the charge sharing capacitor.

3. The SRAM write assist device of claim 1, wherein the coupling-capacitor charging circuit includes:
   a charge control circuit configured to generate a charge control signal according to the charge sharing control signal and the first switch signal; and
   the charge switch configured to be turned on or turned off according to the charge control signal.

4. The SRAM write assist device of claim 1, wherein the negative voltage coupling circuit includes:
   a switch signal generating circuit configured to generate the first switch signal according to a write assist control signal;
   a first switch coupled between the second terminal of the charge sharing capacitor and the first low voltage terminal, the first switch configured to be turned on according to the first switch signal in the charge sharing phase and the charge phase, and configured to be turned off according to the first switch signal in the negative voltage generation phase; and
   a second switch coupled between the first terminal of the charge sharing capacitor and the second low voltage terminal, the second switch configured to be turned off according to the write assist control signal in the charge sharing phase and the charge phase, and configured to be turned on according to the write assist control signal in the negative voltage generation phase.

5. The SRAM write assist device of claim 4, wherein the first switch signal is equivalent to an inverted signal of the write assist control signal.

6. The SRAM write assist device of claim 4, wherein the switch signal generating circuit includes:
   a first inverter configured to receive the write assist control signal to generate the first switch signal; and
   a second inverter configured to receive the first switch signal to generate a second switch signal equivalent to the write assist control signal, and then output the second switch signal to the second switch.

7. A static random access memory (SRAM) write assist method, comprising:
   in a write preparation phase, supplying a power voltage to a column of SRAM cells according to a power supply selection signal, and then stopping supplying the power voltage to the column of SRAM cells according to the power supply selection signal to let a voltage at a power-receiving terminal of the column of SRAM cells be in a floating state;
   in a write drive phase, switching on a first path between the column of SRAM cells and a voltage coupling circuit according to a data signal to couple a bit line of the column of SRAM cells with a first low voltage terminal through the voltage coupling circuit and thereby pull down a voltage of the bit line of the column of SRAM cells to a voltage of the first low voltage terminal;

in a charge sharing phase, switching on a second path between the power-receiving terminal of the column of SRAM cells and a first terminal of a charge sharing capacitor included in the voltage coupling circuit according to a charge sharing control signal to lower the voltage at the power-receiving terminal of the column of SRAM cells by charge sharing between the power-receiving terminal of the column of SRAM cells and the first terminal of the charge sharing capacitor;

in a charge phase, switching on a third path between an operation voltage terminal and the first terminal of the charge sharing capacitor according to the charge sharing control signal and a first switch signal to charge the charge sharing capacitor with a voltage at the operation voltage terminal, wherein in the charge phase the second path between the power-receiving terminal of the column of SRAM cells and the first terminal of the charge sharing capacitor is shut off; and in a voltage generation phase, coupling the first terminal of the charge sharing capacitor with a second low voltage terminal and coupling a second terminal of the charge sharing capacitor with the bit line of the column of SRAM cells to pull down the voltage of the bit line of the column of SRAM cells, wherein in the voltage generation phase the third path between the operation voltage terminal and the first terminal of the charge sharing capacitor is shut off and the first path for coupling the bit line of the column of SRAM cells with the first low voltage terminal through the voltage coupling circuit is shut off.

8. The method of claim 7, wherein a step for switching on the second path includes:

in the charge sharing phase switching on a path between the power-receiving terminal of the column of SRAM cells and a charge sharing switch according to a column selection signal, wherein the column selection signal is related to the power supply selection signal; and in the charge sharing phase turning on the charge sharing switch according to the charge sharing control signal to let the power-receiving terminal of the column of SRAM cells be coupled to the first terminal of the charge sharing capacitor.

9. The method of claim 7, further comprising:

in the charge sharing phase switching on a fourth path between the power-receiving terminal of the column of SRAM cells and a charge sharing switch according to a column selection signal, wherein the column selection signal is related to the power supply selection signal; and in the charge sharing phase switching on a fifth path between the charge sharing switch and the first terminal of the charge sharing capacitor.

10. The method of claim 7, further comprising:

generating a charge control signal according to the charge sharing control signal and the first switch signal; and switching on or switching off the third path between the operation voltage terminal and the first terminal of the charge sharing capacitor according to the charge control signal.

11. The method of claim 7, further comprising:

in the charge sharing phase and the charge phase switching on a fourth path between the second terminal of the charge sharing capacitor and the first low voltage terminal according to the first switch signal;

in the voltage generation phase switching off the fourth path;

in the charge sharing phase and the charge phase switching off a fifth path between the first terminal of the charge sharing capacitor and the second low voltage terminal by a write assist control signal; and in the voltage generation phase switching on the fifth path by the write assist control signal.

12. The method of claim 11, wherein the first switch signal is equivalent to an inverted signal of the write assist control signal.

\* \* \* \* \*